United States Patent
Hu

(10) Patent No.: US 11,690,256 B2
(45) Date of Patent: Jun. 27, 2023

(54) ORGANIC LIGHT EMITTING DIODE DISPLAY PANEL FOR IMPROVING LIGHT TRANSMITTANCE AND ORGANIC LIGHT EMITTING DIODE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Junyan Hu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 214 days.

(21) Appl. No.: 16/641,333

(22) PCT Filed: Jan. 9, 2020

(86) PCT No.: PCT/CN2020/071187
§ 371 (c)(1),
(2) Date: Feb. 24, 2020

(87) PCT Pub. No.: WO2021/051729
PCT Pub. Date: Mar. 25, 2021

(65) Prior Publication Data
US 2021/0408184 A1   Dec. 30, 2021

(30) Foreign Application Priority Data

Sep. 17, 2019  (CN) .......................... 201910878176.X

(51) Int. Cl.
*H10K 59/123*   (2023.01)
*H10K 59/124*   (2023.01)
(Continued)

(52) U.S. Cl.
CPC ......... *H10K 59/123* (2023.02); *H10K 59/124* (2023.02); *H10K 59/1213* (2023.02);
(Continued)

(58) Field of Classification Search
CPC ............. H01L 27/3248; H01L 27/3258; H01L 27/3262; H01L 27/3276; H01L 51/0097; H01L 2251/5338
(Continued)

(56) References Cited

U.S. PATENT DOCUMENTS

2005/0269941 A1\* 12/2005 Kim .................... H01L 51/5218
                                                                    313/503
2017/0170206 A1\*  6/2017 Lee .................... H01L 29/78633
(Continued)

FOREIGN PATENT DOCUMENTS

CN     1705420 A    12/2005
CN   101707028 A     5/2010
(Continued)

*Primary Examiner* — Xia L Cross

(57) ABSTRACT

An organic light emitting diode display panel and an organic light emitting diode display device are provided. The display panel includes a first display region and a second display region disposed adjacent to the first display region. A thin film transistor layer is disposed on the first substrate layer. A display function of the second display region is controlled by the thin film transistor of the first display region. Thus, the second display region is ensured to normally display images, a layered structure of the second display region is simplified, and a light transmittance of the second display region is improved. The functional requirements of front-facing photosensitive elements, such as cameras, can be met, so that it is conducive to achieve full-screen display.

12 Claims, 4 Drawing Sheets

(51) Int. Cl.
*H10K 59/121* (2023.01)
*H10K 59/131* (2023.01)
*H10K 77/10* (2023.01)
*H10K 102/00* (2023.01)

(52) U.S. Cl.
CPC .......... *H10K 59/131* (2023.02); *H10K 77/111* (2023.02); *H10K 2102/311* (2023.02)

(58) Field of Classification Search
USPC .......................................................... 257/40
See application file for complete search history.

(56) References Cited

U.S. PATENT DOCUMENTS

| | | | |
|---|---|---|---|
| 2018/0190748 A1* | 7/2018 | Im ........................ | H01L 51/5284 |
| 2019/0355799 A1* | 11/2019 | Jeong .................. | H01L 27/3262 |
| 2020/0089368 A1* | 3/2020 | Shim ................... | H01L 27/3276 |
| 2020/0251539 A1* | 8/2020 | Fu ........................ | H01L 27/3288 |

FOREIGN PATENT DOCUMENTS

| | | |
|---|---|---|
| CN | 104752461 A | 7/2015 |
| CN | 108254954 A | 7/2018 |
| CN | 108258014 A | 7/2018 |
| CN | 108550612 A | 9/2018 |
| CN | 108630830 A | 10/2018 |
| CN | 109273512 A | 1/2019 |
| CN | 109461742 A | 3/2019 |
| CN | 109599422 A | 4/2019 |
| CN | 109935202 A | 6/2019 |
| CN | 110071148 A | 7/2019 |
| CN | 110176474 A | 8/2019 |

\* cited by examiner

ORGANIC LIGHT EMITTING DIODE DISPLAY PANEL FOR IMPROVING LIGHT TRANSMITTANCE AND ORGANIC LIGHT EMITTING DIODE DISPLAY DEVICE

CROSS REFERENCE TO RELATED APPLICATIONS

This application claims the priority of a Chinese patent application No. 201910878176.X, filed on Sep. 17, 2019, with the Chinese Patent Office, entitled "Organic Light Emitting Diode Display Panel and Organic Light Emitting Diode Display Device", the contents of which are incorporated herein by reference in their entirety.

FIELD OF INVENTION

This disclosure relates to a field of display technology, and more particularly, to an organic light emitting diode display panel and an organic light emitting diode display device.

BACKGROUND OF INVENTION

With the development of display technology, terminal display devices, such as mobile phones, are pursuing increasingly higher screen-body ratios. Organic light emitting diode display panels have been popularized for their many advantages, such as self-illumination, low driving voltages, high luminous rate, short response times, high resolution and contrast, wide viewing angles, and flexible display, large-area full-color display and other excellent characteristics. Therefore, the full-screen designs based on organic light emitting diode display technology have become important directions of research and development.

In terminal devices, such as mobile phones, the configuration of devices in the front, such as front cameras and photoelectric sensors, is an important factor affecting the screen-body ratio of a display panel. In conventional technology, in order to achieve a high screen-body ratio, devices, such as front cameras, photoelectric sensors, and other devices are disposed in a gathered non-display area to reduce their occupied space. As a result, products such, as "notch screen" and "water drop notch screen" appear. However, in the conventional technology, since the non-display area cannot be completely eliminated, it is difficult to achieve a true full-screen design.

SUMMARY OF INVENTION

It is difficult to achieve a true full-screen design, due to the configuration of the non-display area of the display panel. It is necessary to solve the drawback for achieving the full-screen display of the entire display panel in this field under the premise of meeting the optical requirements of the photosensitive element of the display panel.

In order to solve the above-mentioned drawback, the disclosure provides a technical solution as follow.

The disclosure provides an organic light emitting diode display panel. The organic light emitting diode display panel comprises:

a first display region comprising a first substrate layer, a thin film transistor layer disposed on the first substrate layer, and a first pixel layer disposed on the thin film transistor layer; and a second display region disposed adjacent to the first display region, wherein the second display region comprises a second substrate layer and a second pixel layer disposed on the second substrate layer;

wherein the first pixel layer comprises a first anode, the second pixel layer comprises a second anode, the thin film transistor layer comprises a thin film transistor, and the first anode and the second anode are electrically connected to the thin film transistor.

In the organic light emitting diode display panel of the disclosure, the first substrate layer and the second substrate layer are integrated into an integrated structure as a substrate layer. The substrate layer comprises a first flexible layer, a first buffer layer disposed on the first flexible layer, and a second flexible layer disposed on the first buffer layer.

In the organic light emitting diode display panel of the disclosure, a second buffer layer is disposed between the first substrate layer and the thin film transistor layer, and a first planarization layer is disposed between the thin film transistor layer and the first pixel layer.

In the organic light emitting diode display panel of the disclosure, a second planarization layer is disposed between the second substrate layer and the second pixel layer.

In the organic light emitting diode display panel of the disclosure, a thickness of the second display region is less than a thickness of the first display region.

In the organic light emitting diode display panel of the disclosure, a thickness of the second planarization layer is greater than or equal to a thickness of the first planarization layer.

In the organic light emitting diode display panel of the disclosure, the thin film transistor layer further comprises: an active layer, a first insulating layer disposed on the active layer, a first metal layer disposed on the first insulating layer, a second insulating layer disposed on the first metal layer, a second metal layer disposed on the second insulating layer, and a third insulating layer disposed on the second metal layer, and an electrode layer disposed on the third insulating layer.

In the organic light emitting diode display panel of the disclosure, a first through hole is disposed penetrating through the first insulating layer, the second insulating layer, and the third insulating layer, and the electrode layer is electrically connected to the active layer through the first through hole.

In the organic light emitting diode display panel of the disclosure, a second through hole is disposed on the first planarization layer, and the first anode is electrically connected to the electrode layer through the second through hole.

In the organic light emitting diode display panel of the disclosure, a metal trace is disposed between the second substrate layer and the second planarization layer, and the metal trace is electrically connected to the electrode layer.

In the organic light emitting diode display panel of the disclosure, a third through hole is disposed on the second planarization layer, and the second anode is electrically connected to the metal trace through the third through hole.

In the organic light emitting diode display panel of the disclosure, a bonding interface of the first display region and the second display region is stepped, and the metal trace is electrically connected to the electrode layer along the stepped bonding interface.

In the organic light emitting diode display panel of the disclosure, the first pixel layer further comprises a first pixel defining layer disposed on the first anode, and a first cathode layer disposed on the first pixel defining layer.

In the organic light emitting diode display panel of the disclosure, the second pixel layer further comprises a second pixel defining layer disposed on the second anode, and a second cathode layer disposed on the second pixel defining layer.

In the organic light emitting diode display panel of the disclosure, the organic light emitting diode display panel further comprises a bending region, and the bending region is disposed outside a display region composed of the first display region and the second display region.

In the organic light emitting diode display panel of the disclosure, the bending region comprises a third substrate layer and a metal wiring layer disposed on the third substrate layer.

In the organic light emitting diode display panel of the disclosure, a transition layer is disposed between the third substrate layer and the metal wiring layer, and the transition layer is made of a flexible material for bending the bending region to a back side of the display panel.

In the organic light emitting diode display panel of the disclosure, a thin film encapsulation layer is disposed on the first display region, the second display region, and the bending region.

The disclosure further provides an organic light emitting diode display device comprising an organic light emitting diode display panel as mentioned above, and a photosensitive element disposed on a back surface of a second display region.

In the organic light emitting diode display device of the disclosure, a second anode is electrically connected to a thin film transistor through a metal trace disposed in the second display region.

Advantageous effects of the disclosure are as follows. The disclosure provides an organic light emitting diode display panel and an organic light emitting diode display device. A display function of the second display region is controlled by the thin film transistor of the first display region. Thus, the second display region is ensured to normally display images, a layered structure of the second display region is simplified, and a light transmittance of the second display region is improved. The functional requirements of front-facing photosensitive elements, such as cameras, can be met, so that it is conducive to achieve the full-screen display.

DESCRIPTION OF DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED EMBODIMENTS

Figure 1:
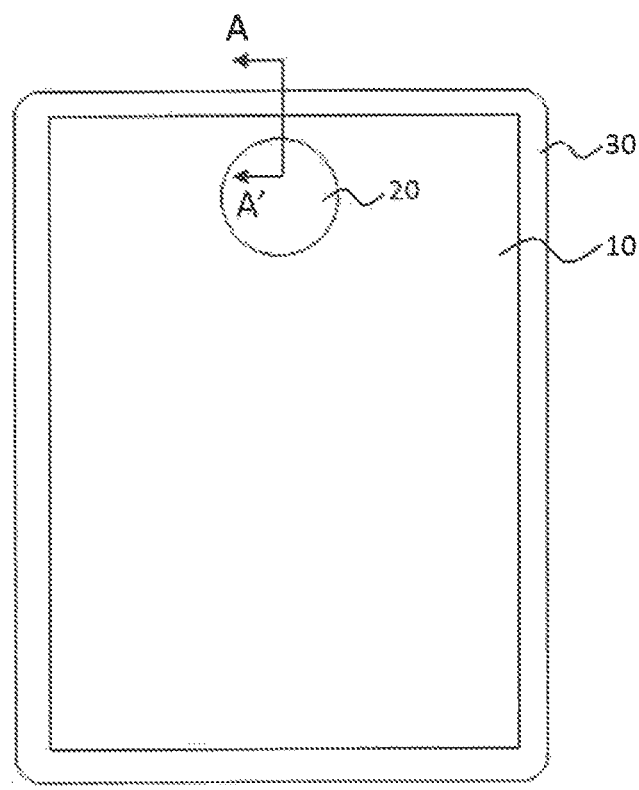
FIG. 1 is a planar structural schematic diagram of an organic light emitting diode display panel in this embodiment of the disclosure.

This description of the exemplary embodiments is intended to be read in connection with the accompanying drawings, which are to be considered part of the entire written description. In the description, terms such as "upper", "lower", "front", "back", "left", "right", "inside", "outside", and "side", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar components are labeled with the same number.

An embodiment of the disclosure provides an organic light emitting diode display panel, which includes a second display region disposed above a front photosensitive element, such as a camera, and a first display region disposed adjacent to the second display region. An effective display area of the display panel comprises the first display region and the second display region. A display function of the second display region is controlled by a thin film transistor of the first display region, thereby eliminating the need for disposing a device layer, such as a thin film transistor in the second display region, and improving a light transmittance of the second display region. On the basis of meeting the optical requirements of the front photosensitive element, a normal display function of the second display region is realized, and then the full-screen display is realized.

Figure 2:
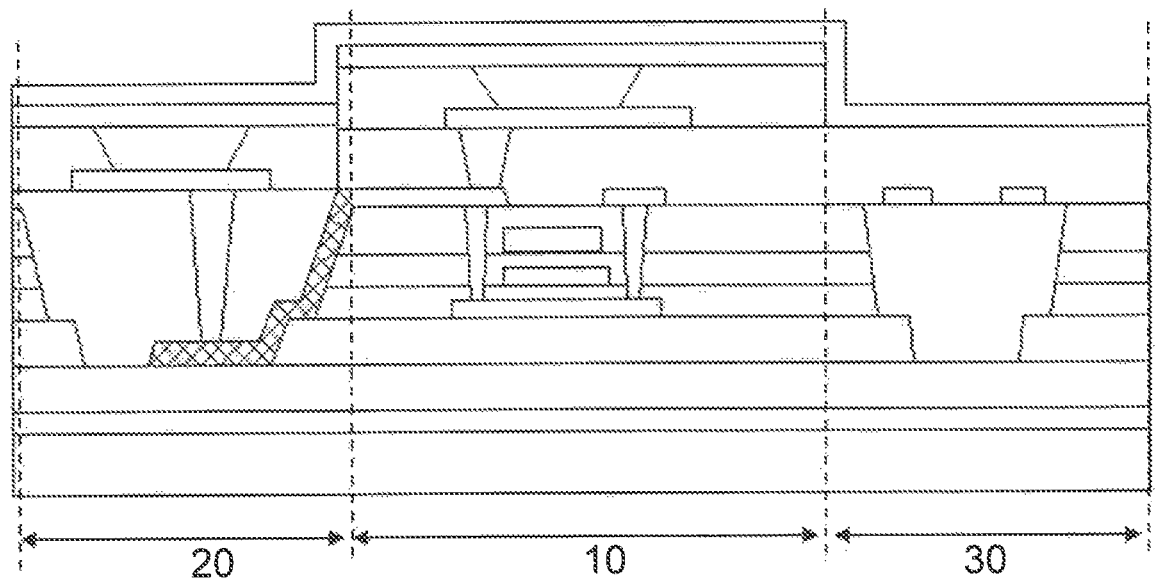
FIG. 2 is a cross-sectional schematic diagram of the organic light emitting diode display panel as shown in FIG. 1 along A-A'.

Referring to FIG. 1 and FIG. 2, a planar structural schematic diagram of an organic light emitting diode display panel in this embodiment of the disclosure and a cross-sectional schematic diagram of the organic light emitting diode display panel as shown in FIG. 1 along A-A' are shown. The organic light emitting diode display panel includes a first display region 10 and a second display region 20 disposed in contact with the first display region 10. Optionally, the first display region 10 covers most area of the display panel, and the second display area 20 covers a small area of the display panel. The second display region 20 is composed of a single region or a plurality of independent regions. Photosensitive elements, such as a camera and a photoelectric sensor, may be disposed on a back side of the second display region 20, and external light can be directed to the photosensitive elements, such as the camera and the photoelectric sensor, through the second display region 20 for achieving their functions.

Optionally, the organic light emitting diode display panel further includes a bending region 30 disposed outside a display region composed of the first display region 10 and the second display region 20. The bending region 30 has no display function, and the bending region 30 includes metal traces electrically connected to the first display region 10 and the second display region 20, and is used for providing the first display region 10 and the second display region 20 with various voltage signals or current signals. Optionally, the bending region 30 is bent to the back side of the organic light emitting diode display panel, so that a front surface of the display panel has a larger screen-body ratio.

Figure 2A:
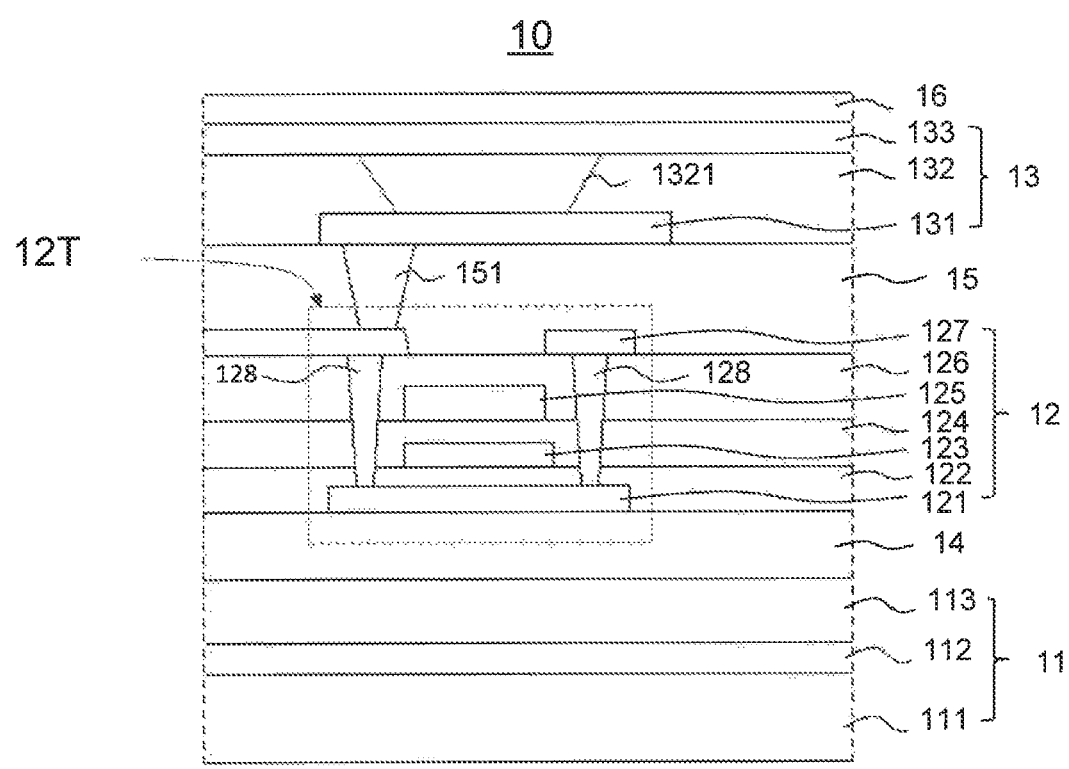
FIG. 2a is a structural schematic diagram of a first display region 10 in the cross-sectional schematic diagram of the organic light emitting diode display panel as shown in FIG. 2.
Figure 2B:
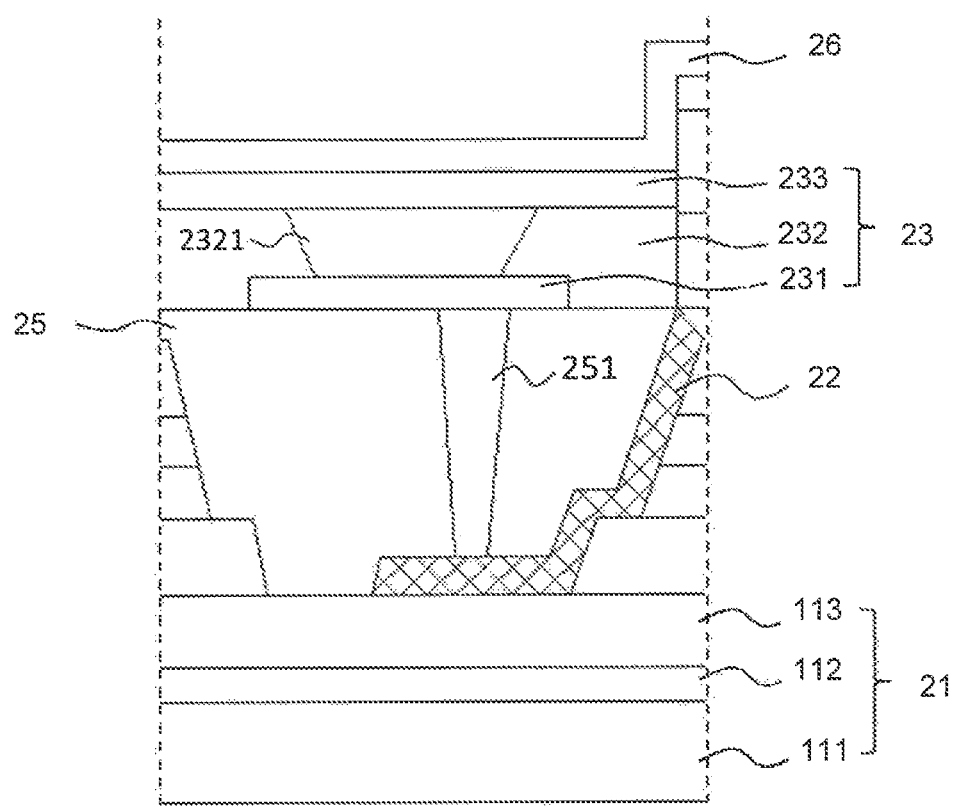
FIG. 2b is a structural schematic diagram of a second display region 20 in the cross-sectional schematic diagram of the organic light emitting diode display panel as shown in FIG. 2.
Figure 2C:
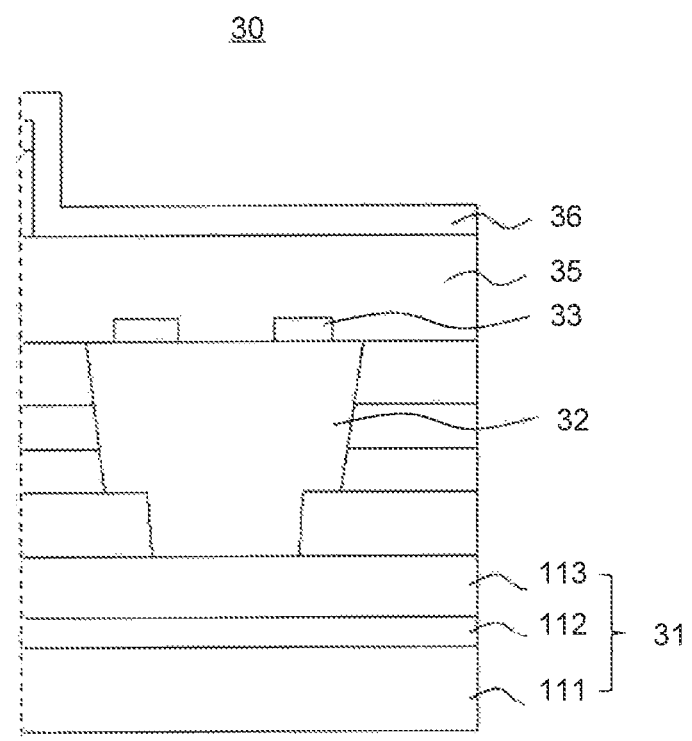
FIG. 2c is a structural schematic diagram of a bending region 30 in the cross-sectional schematic diagram of the organic light emitting diode display panel as shown in FIG. 2.

Referring to FIG. 2 and FIG. 2a to FIG. 2c, FIG. 2a is a structural schematic diagram of a first display region 10 in the cross-sectional schematic diagram of the organic light emitting diode display panel shown in FIG. 2, FIG. 2b is a structural schematic diagram of a second display region 20 in the cross-sectional schematic diagram of the organic light emitting diode display panel shown in FIG. 2, and FIG. 2c is a structural schematic diagram of a bending region 30 in the cross-sectional schematic diagram of the organic light emitting diode display panel shown in FIG. 2. It should be noted that the partial structures as shown in FIG. 2a to FIG. 2c are completely the same as the structures of the corresponding positions of the organic light emitting diode display panel as shown in FIG. 2. The figures here are only for the convenience of describing their layered structures.

The first display region 10 includes a first substrate layer 11, a thin film transistor layer 12 disposed on the first substrate layer 11, and a first pixel layer 13 disposed on the thin film transistor layer 12. The second display region 20 includes a second substrate layer 21 and a second pixel layer 23 disposed on the second substrate layer 21. The bending region 30 includes a third substrate layer 31 and a metal wiring layer 33 disposed on the third substrate layer 31.

It should be understood that, in the second display region 20, a thin film transistor layer is not disposed between the second substrate layer 21 and the second pixel layer 23, thereby eliminating the influence of the thin film transistor layer on the light transmittance of the second display region 20, and reducing an overall thickness of the second display region 20, so that the thickness of the second display region 20 is less than a thickness of the first display region 10. The light transmittance of the second display region 20 is further improved.

Optionally, the first substrate layer 11, the second substrate layer 21, and the third substrate layer 31 are integrated into an integrated structure as a substrate layer. The substrate layer composed of the first substrate layer 11, the second substrate layer 21, and the third substrate layer 31 includes a first flexible layer 111, and a first buffer layer 112 disposed on the first flexible layer 111, and a second flexible layer 113 disposed on the first buffer layer 112. Optionally, a material of the first flexible layer 111 and the third flexible layer 113 can be the same, and the material can be flexible plastic materials, such as polyethylene terephthalate, polyethylene naphthalate, or polyimide. The first buffer layer 112 can be made of inorganic materials such as silicon oxide or silicon nitride, and the first buffer layer 112 can prevent the outside air or water vapor from invading the internal of display panel.

The thin film transistor layer 12 is disposed on the first substrate layer 11. Optionally, a second buffer layer 14 is disposed between the thin film transistor layer 12 and the first substrate layer 11. The buffer layer 14 can be made of an inorganic material such as silicon oxide or silicon nitride. The second buffer layer 14 can prevent outside air or water vapor from entering the display panel.

Optionally, the thin film transistor layer 12 includes an active layer 121, a first insulating layer 122 disposed on the active layer 121, a first metal layer 123 disposed on the first insulating layer 122, a second insulating layer 124 disposed on the first metal layer 123, a second metal layer 125 disposed on the second insulating layer 124, a third insulating layer 125 disposed on the second metal layer 125, and an electrode layer 127 disposed on the third insulating layer 126.

The active layer 121 is made of an amorphous silicon layer, a silicon oxide layer, or a polysilicon layer, or is made of an organic semiconductor material. The active layer 121 includes a channel region in the middle of the active layer and includes a source region and a drain region at both ends of the channel region. The first insulating layer 122 completely covers the active layer 121. The first insulating layer 122 is made of silicon oxide, silicon nitride, or other insulating organic or inorganic materials. The first metal layer 123 is insulated from the active layer 121 by the first insulating layer 122. The second insulating layer 124 completely covers the first metal layer 123. The second insulating layer 124 is made of silicon oxide, silicon nitride, or other insulating organic or inorganic materials. The second metal layer 125 is insulated from the first metal layer 123 by the second insulating layer 124. The third insulating layer 126 completely covers the second metal layer 125. The third insulating layer 126 is made of silicon oxide, silicon nitride, or other insulating organic or inorganic materials. The electrode layer 127 is insulated from the second metal layer 125 by the third insulating layer 126. Optionally, the electrode layer 127 includes a source and a drain. A first through hole 128 is disposed to penetrate through the first insulating layer 122, the second insulating layer 124, and the third insulating layer 126, and the source and the drain are electrically connected to the active layer 121 through the first through hole 128. Specifically, the source is electrically connected to the source region of the active layer 121, and the drain is electrically connected to the drain region of the active layer 121. It should be noted that the active layer 121, the first insulating layer 122, the first metal layer 123, the second insulating layer 124, the second metal layer 125, the third insulating layer 126, and the electrode layer 127 jointly form a thin film transistor 12T. The thin film transistor layer 12 includes a plurality of the thin film transistors 12T, and the thin film transistors 12T are configured to control a display function of the display panel. Specifically, a gate of the thin film transistor 12T is electrically connected to an external scan line, a source of the thin film transistor 12T is electrically connected to a data line, and a drain of the thin film transistor 12T is electrically connected to a corresponding pixel unit. The thin film transistor 12T transmits the data signal to the pixel unit under the control of the scan signal, thereby controlling a display function of the pixel unit.

Optionally, a first planarization layer 15 is disposed between the thin film transistor layer 12 and the first pixel layer 13, and the first planarization layer 15 is configured to form a flat surface on a surface of the thin film transistor layer 12, so that the first pixel layer 13 can be disposed on the first planarization layer 15. Optionally, the first planarization layer 15 is formed of an organic material. A second through hole 151 is disposed on the first planarization layer 151, and the second through hole 151 is configured to maintain the thin film transistor layer 12 and the first pixel layer 13 to be electrically connected.

Optionally, the first pixel layer 13 includes a first anode 131, a first pixel defining layer 132, and a first cathode 133. The first anode 131 is electrically connected to the thin film transistor layer 12 through the second through hole 151. Specifically, the first anode 131 is electrically connected to a drain of the thin film transistor 12T. The first cathode 133 is electrically connected to an external circuit. The first pixel defining layer 132 includes a first light emitting unit 1321, and the first light emitting unit 1321 emits light under the action of electrical signals of the first anode 131 and the first cathode 133. Optionally, the first light emitting unit 1321 can emit at least three colors of red, green, and blue.

Optionally, the first display region 10 further includes a first encapsulation layer 16 disposed on the first cathode 133. The first encapsulation layer 16 is configured to isolate the first pixel layer 13 from the outside and prevent the outside substances from entering or contacting the first pixel layer 13.

Optionally, the second pixel layer 23 includes a second anode 231, a second pixel defining layer 232, and a second cathode layer 233. The second anode 231 is electrically connected to the thin film transistor layer 12. Specifically, the second anode 231 is electrically connected to a drain of the thin film transistor 12T. The second cathode 233 is electrically connected to an external circuit. The second pixel defining layer 232 includes a second light emitting unit 2321, and the second light emitting unit 2321 is configured to emit light under the action of the electrical signals of the second anode 231 and the second cathode 233. Optionally, the second light emitting unit 2321 can emit at least three colors of red, green, and blue. The thin film transistor 12T controls the light-emitting function of the second light emitting unit 2321 by providing the electrical signals for the second anode 231, thereby controlling the display function of the second display region 20. It should be understood that using the thin film transistor 12T disposed in the first display region 10 to control the display function of the second display region 20 can omit the disposition of the thin film transistor and other related devices in the second display region 20. Therefore, the influence of the display device on the light transmittance of the second display region 20 is eliminated, the light transmittance in the second display region 20 of the display panel is improved. It provides advantageous conditions for the front camera and other photosensitive elements to achieve their functions.

It should be noted that the illustrated structure only shows a position of the thin film transistor 12T and the connection relationship between the second pixel layer 23 and the thin film transistor 12T, and does not mean that the second pixel layer 23 and the first pixel layer 13 are connected to the same thin film transistor. Actually, each pixel unit in the first pixel layer 13 and each pixel unit in the second pixel layer 23 respectively correspond to one thin film transistor. The illustrated structure only indicates that the thin film transistor controlling the second pixel layer 23 is disposed in the first display region 10.

Specifically, a second planarization layer 25 is disposed between the second substrate layer 21 and the second pixel layer 23, and the second planarization layer 25 comprises a relatively flat upper surface to facilitate the disposition of the second pixel layer 23. A metal trace 22 is disposed at a junction between the second planarization layer 25 and the thin film transistor layer 12, and the metal trace 22 is electrically connected to the electrode layer 127. Specifically, the metal trace 22 is electrically connected to the drain of the thin film transistor 12T. A third through hole 251 is disposed on the second planarization layer 25. The second anode 231 is electrically connected to the metal trace 22 through the third through hole 251, so that the drain of the thin film transistor 12T is electrically connected to the second anode 231. The light-emitting display function of the second pixel layer 23 is controlled by the thin film transistor 12T, so that the second display region 20 can display normally.

Optionally, a thickness of the second planarization layer 25 is greater than the thickness of the first planarization layer 15.

Optionally, a bonding interface of the first display region 10 and the second display region 20 is stepped, and the metal trace 22 is disposed along the stepped bonding interface. It should be understood that the bonding interface between the first display region 10 and the second display region 20 is a bonding interface between the second planarization layer 25 and the thin film transistor layer 12. Since when the first substrate layer 11, the second substrate layer 21, the first pixel layer 13, and the second pixel layer 23 are all integrated into an integrated structure, the structural difference between the first display region 10 and the second display region 20 is mainly reflected in the structural difference between the thin film transistor layer 12 and the second planarization layer 25.

Optionally, a second encapsulation layer 26 is disposed on the second cathode layer 233, and the second encapsulation layer 26 is used to isolate the second pixel layer 23 from the outside and prevent the outside substances from entering or contacting the second pixel layer 23.

Optionally, a transition layer 32 is disposed between the third substrate layer 31 and the metal wiring layer 33, and the transition layer 32 is made of flexible material for bending the bending region to a back side of the display panel.

Optionally, the metal wiring layer 33 includes signal lines, such as data lines and scan lines, which are electrically connected to the first display region 10 and/or the second display region 20, for providing voltage signal or current signal to realize the display function of the first display region 10 and/or the second display region 20.

Optionally, a third planarization layer 35 is disposed on the metal wiring layer 33, and a third encapsulation layer 36 is disposed on the third planarization layer 35 to form a closed state of the bending region 30.

Optionally, the first planarization layer 15, the second planarization layer 25, and the third planarization layer 35 can be manufactured through the same process simultaneously to simplify a manufacturing process. The first pixel layer 13 and the second pixel layer 23 can also be manufactured through the same process simultaneously. The first encapsulation layer 16, the second encapsulation layer 26, and the third encapsulation layer 36 may be an integrated structure, and are manufactured through the same process simultaneously. That achieves the effect of simplifying the manufacturing process.

The embodiment of the disclosure provides an organic light emitting diode display panel. A display function of the second display region is controlled by the thin film transistor of the first display region. Thus, the second display region displaying a picture normally is ensured, a layered structure of the second display region is simplified, and a light transmittance of the second display region is improved. The functional requirements of front-facing photosensitive elements, such as cameras, can be met, and it is conducive to achieve full-screen display.

The embodiment of the disclosure provides an organic light emitting diode display panel. A display function of the second display region is controlled by the thin film transistor of the first display region. Thus, the second display region is ensured to normally display images, a layered structure of the second display region is simplified, and a light transmittance of the second display region is improved. The functional requirements of front-facing photosensitive elements, such as cameras, can be met, so that it is conducive to achieve the full-screen display.

Another embodiment of the disclosure provides an organic light emitting diode display device comprising the organic light emitting diode display panel and photosensitive elements disposed on a back surface of the display panel according to the above-mentioned embodiment of the disclosure. The photosensitive element may be a front optical functional component, such as a photoelectric sensor or an under-screen camera. The photosensitive element is disposed on the back side of the second display region of the organic light emitting diode display panel. Since the second display region can not only perform a normal display function, but also achieve a high transmittance, the photosensitive elements can effectively perform its function.

This disclosure has been described with preferred embodiments thereof, and it is understood that many changes and modifications to the described embodiment can be carried out without departing from the scope and the spirit of the invention that is intended to be limited only by the appended claims.

What is claimed is:

1. An organic light emitting diode display panel, comprising:
   a first display region comprising a first substrate layer, a thin film transistor layer disposed on the first substrate layer, and a first pixel layer disposed on the thin film transistor layer; and
   a second display region disposed adjacent to the first display region, wherein the second display region comprises a second substrate layer and a second pixel layer disposed on the second substrate layer;
   wherein the first pixel layer comprises a first anode and a first cathode, the second pixel layer comprises a second anode and a second cathode, wherein a bottom surface of the first anode is coplanar with a bottom surface of the second cathode, the thin film transistor layer comprises a thin film transistor, and the first anode and the second anode are electrically connected to the thin film transistor disposed on the first substrate layer of the first display region, the thin film transistor layer is not disposed in the second display region, a pixel unit in the first pixel layer and a pixel unit in the second pixel layer respectively correspond to the thin film transistor disposed on the first substrate layer of the first display region for the thin film transistor disposed in the first display region to control the display function of the second display region;
   wherein a second buffer layer is disposed between the first substrate layer and the thin film transistor layer, and a first planarization layer is disposed between the thin film transistor layer and the first pixel layer;
   wherein a second planarization layer is disposed between the second substrate layer and the second pixel layer;
   wherein the thin film transistor layer further comprises: an active layer, a first insulating layer disposed on the active layer, a first metal layer disposed on the first insulating layer, a second insulating layer disposed on the first metal layer, a second metal layer disposed on the second insulating layer, a third insulating layer disposed on the second metal layer, and an electrode layer disposed on the third insulating layer;
   a first through hole is disposed penetrating through the first insulating layer, the second insulating layer, and the third insulating layer, and wherein the electrode layer is electrically connected to the active layer through the first through hole;
   a second through hole is disposed penetrating through the first planarization layer, and the first anode is electrically connected to the electrode layer through the second through hole;
   wherein a metal trace is disposed between a second flexible layer of the second substrate layer and the second planarization layer, the metal trace is disposed at a junction between the second planarization layer and the thin film transistor layer, the metal trace is electrically connected to the electrode layer and the metal trace is electrically connected to a drain of the thin film transistor;
   wherein a third through hole is disposed penetrating through the second planarization layer, and the second anode is electrically connected to the metal trace through the third through hole; and
   wherein a bonding interface of the first display region and the second display region is stepped, and the metal trace is electrically connected to the electrode layer along the stepped bonding interface.

2. The organic light emitting diode display panel according to claim 1, wherein the first substrate layer and the second substrate layer are integrated into an integrated structure as a substrate layer; and
   wherein the substrate layer comprises a first flexible layer, a first buffer layer disposed on the first flexible layer, and a second flexible layer disposed on the first buffer layer.

3. The organic light emitting diode display panel according to claim 1, wherein a thickness of the second display region is less than a thickness of the first display region.

4. The organic light emitting diode display panel according to claim 1, wherein a thickness of the second planarization layer is greater than or equal to a thickness of the first planarization layer.

5. The organic light emitting diode display panel according to claim 1, wherein the first pixel layer further comprises a first pixel defining layer disposed on the first anode, and the first cathode layer disposed on the first pixel defining layer.

6. The organic light emitting diode display panel according to claim 1, wherein the second pixel layer further comprises a second pixel defining layer disposed on the second anode, and the second cathode layer disposed on the second pixel defining layer.

7. The organic light emitting diode display panel according to claim 1, wherein the organic light emitting diode display panel further comprises a bending region, and the bending region is disposed outside a display region composed of the first display region and the second display region.

8. The organic light emitting diode display panel according to claim 7, wherein the bending region comprises a third substrate layer and a metal wiring layer disposed on the third substrate layer.

9. The organic light emitting diode display panel according to claim 8, wherein a transition layer is disposed between the third substrate layer and the metal wiring layer, and the transition layer is made of a flexible material for bending the bending region to a back side of the display panel.

10. The organic light emitting diode display panel according to claim 7, wherein a thin film encapsulation layer is disposed on the first display region, the second display region, and the bending region.

11. An organic light emitting diode display device, comprising: the organic light emitting diode display panel according to claim 1, and a photosensitive element disposed on a back surface of the second display region.

12. The organic light emitting diode display device according to claim 11, wherein the second anode is electrically connected to the thin film transistor through the metal trace disposed in the second display region.

\* \* \* \* \*